United States Patent [19]
Maeda et al.

[11] Patent Number: 5,554,570
[45] Date of Patent: Sep. 10, 1996

[54] METHOD OF FORMING INSULATING FILM

[75] Inventors: Kazuo Maeda; Noboru Tokumasu; Yoshiaki Yuyama, all of Tokyo, Japan

[73] Assignees: Canon Sales Co., Inc.; Alcantech Co., Inc.; Semiconductor Process Laboratory Co., Ltd., all of, Japan

[21] Appl. No.: 370,247

[22] Filed: Jan. 9, 1995

[30] Foreign Application Priority Data

Jan. 25, 1994 [JP] Japan .................................. 6-006381

[51] Int. Cl.$^6$ .......................... H01L 21/31; H01L 21/316
[52] U.S. Cl. ............................................ 437/235; 437/238
[58] Field of Search .................................. 437/235, 238, 437/240, 241, 243

[56] References Cited

U.S. PATENT DOCUMENTS

| | | | |
|---|---|---|---|
| 4,708,884 | 11/1987 | Chandross et al. | 427/39 |
| 5,051,380 | 9/1991 | Maeda et al. | 437/238 |
| 5,120,680 | 6/1992 | Foo et al. | 437/238 |
| 5,124,014 | 6/1992 | Foo et al. | 204/192.32 |
| 5,378,510 | 1/1995 | Thomas et al. | 427/563 |
| 5,403,630 | 4/1995 | Matsui et al. | 427/583 |

OTHER PUBLICATIONS

Process Technology, vol. 1, pp. 182–190, Wolf et al. Silicon Processing for the VLSI Era.

*Primary Examiner*—R. Bruce Breneman
*Assistant Examiner*—Matthew Whipple
*Attorney, Agent, or Firm*—Lorusso & Loud

[57] ABSTRACT

The present invention relates to a film forming method of forming a silicon containing insulating film by plasma CVD. Objects of the present invention are to form, using a highly safe reaction gas, an insulating film which is dense, has excellent step coverage and is low in moisture and in organic residues such as carbon. The insulating film has good affinity for the silicon oxide film formed by the thermal CVD method. The invention also enables control of the refractive index and stress etc. of the insulating film formed. The mixed gas, including the organic compound having Si-H bonds and the oxidizing gas, is converted to a plasma and the silicon containing insulating film is formed on a deposition substrate from the plasma.

19 Claims, 10 Drawing Sheets

FIG.2A $(CH_3O)_3SiH + N_2O$

N₂O GAS/SiH₄ CONTAINING GAS FLOW RATE RATIO

FIG.10

O₂ GAS/TEOS CONTAINING GAS FLOW RATE RATIO

METHOD OF FORMING INSULATING FILM

BACKGROUND OF THE INVENTION

1. Field of the Invention

The present invention relates to a method of forming a silicon containing insulating film by the plasma CVD method.

2. Description of the Prior Art

Conventionally, the silicon containing insulating film formed by the plasma CVD method has, in general, the merit of a density that provides a low moisture permeability, and the merit that the amount of moisture in the insulating film is small.

Thus, such an insulating film has often been used as a covering film for an insulating film which has a considerably larger moisture permeability but possesses good step coverage.

A conventional method of forming the silicon containing insulating film by the plasma CVD method will be described with reference to FIGS. 1A to 1D which are cross sectional views showing an interlayer insulating film having a three layered structure, which is formed by sandwiching the silicon oxide film formed by the thermal CVD method between silicon containing insulating films formed by the plasma CVD method. In this case, a parallel plate type plasma CVD apparatus is used as the plasma CVD apparatus.

Figure 1A:
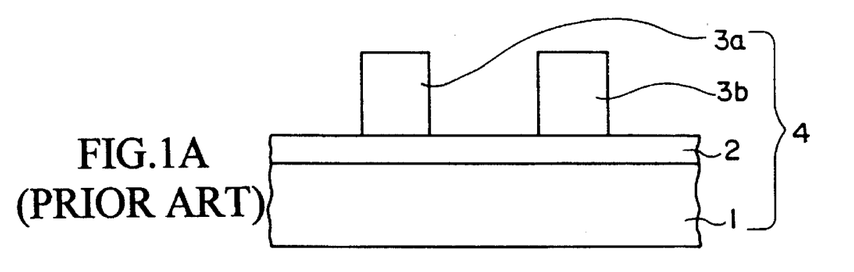
FIGS. 1A to 1D are cross-sectional schematic views showing a conventional method of forming an insulating film.

FIG. 1A is a cross sectional view showing a structure obtained after interconnection layers are formed and before the silicon containing insulating film is formed by the plasma CVD method.

In FIG. 1A, a numeral 1 denotes a silicon substrate; 2, a backing insulating film on the silicon substrate 1; and 3a and 3b, interconnection layers formed on the backing insulating film 2, spaced from each other by a predetermined distance. These layers constitute a deposition substrate 4.

Figure 1B:
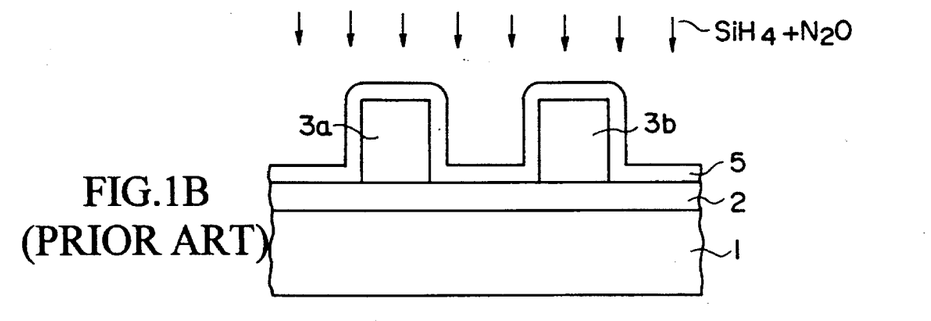

As shown in FIG. 1B, first the deposition substrate 4 is placed in an evacuated chamber, then a reaction gas composed of a mixed gas of $SiH_4+N_2O$ is introduced into the chamber for contact with the deposition substrate 4, and then the reaction gas is converted into a plasma by high frequency electric power (RF electric power). The $N_2O$ gas is dissociated into activated nitrogen N* and activated oxygen O* which react with the $SiH_4$ to form the silicon containing insulating film 5, i.e. a $SiO_xN_y$ film covering the interconnection layers 3a, 3b. By adjusting x and y in the above $SiO_xN_y$ film 5 through controlling reaction conditions, refractive index and etching speed, both closely related to denseness of the insulating film etc., can be controlled, and also film stress and the like can be adjusted. For instance, the refractive index can be controlled within a range 1.45 to 2.0 and can therefore be adjusted as required.

Figure 1C:
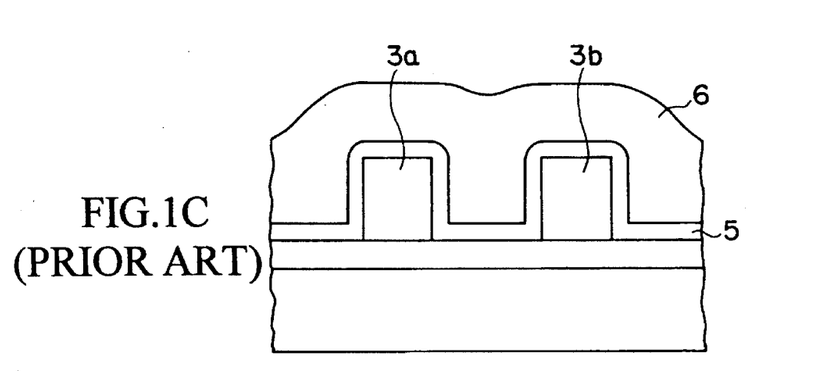

Then, as shown in FIG. 1C, a silicon oxide film (referred to as "NSG film" hereinafter) 6 is formed on the silicon containing insulating film 5 by the thermal CVD method using a mixed gas of $TEOS+O_3$.

Figure 1D:
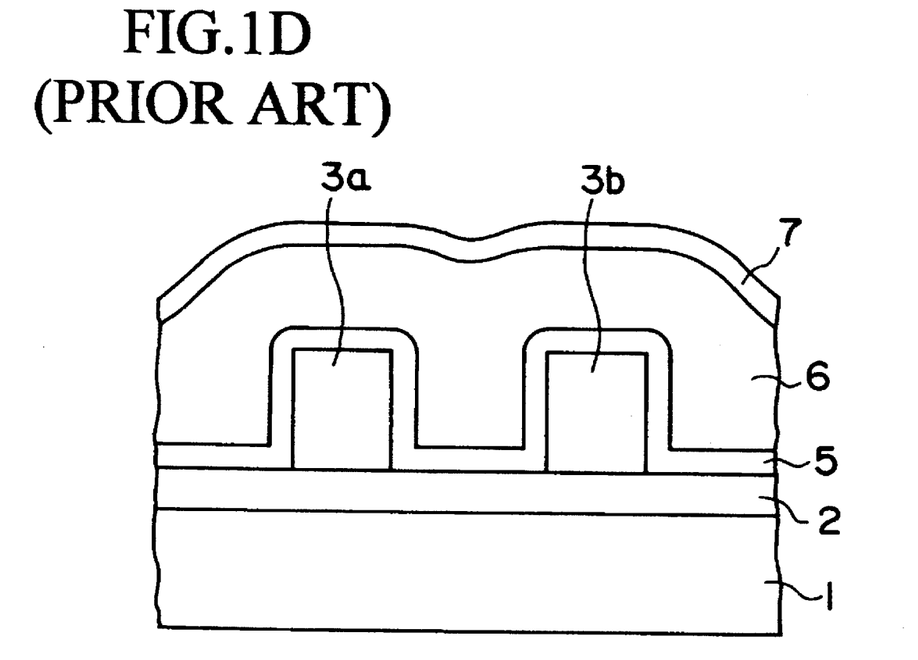

Next, as shown in FIG. 1D, the reaction gas, a mixture of $SiH_4+N_2O$, is converted to a plasma for reaction in the same manner as in FIG. 1B. Consequently, the silicon containing insulating film 7 made of $SiO_xN_y$ is formed on the silicon oxide film 6.

Since the $SiO_xN_y$ films 5 and 7, formed as described above, have inferior step coverage, they are not suitable for filling the recesses between the narrowly spaced interconnection layers 3a and 3b or for formation on a deposition substrate 4 having an uneven surface. Further, the $SiH_4$ gas itself is well known as a highly dangerous gas.

Instead of a mixed gas of $SiH_4+N_2O$, a mixed gas of $SiH_4+O_2$, may be used. However, the gaseous mixture of $SiH_4+O_2$ is not suitable for use in the plasma CVD method since it is highly reactive in gas phase.

In order to avoid the above drawback, a TEOS reaction gas has recently been used, instead of a reaction gas containing $SiH_4$, in the plasma CVD method. For example, a reaction gas of $TEOS/O_2$ offers various advantages over a reaction gas of $SiH_4+O_2$, in that the $SiO_2$ film (silicon containing insulating film) can be formed under any conditions, with high safety, and excellent step coverage of the formed insulating film can be achieved.

However, since an organic compound is used as a reactant, there are many drawbacks in that the formed $SiO_2$ film contains carbon and considerable moisture, and it has a high moisture permeability.

Although the $SiO_2$ film can be formed under any conditions, it is hard to control the refractive index and the film stress of the insulating film. Thus the insulating film formed using TEOS as a reactant lacks flexibility in practical applications. For instance, the refractive index is always about 1.45.

Furthermore, in the case illustrated in FIG. 1D, the interlayer insulating film having a three layered structure, which is formed by sandwiching tile silicon oxide film formed by the thermal CVD method between silicon containing insulating films formed by the plasma CVD method, the silicon containing insulating film formed from $TEOS/O_2$ is less conforming to the silicon oxide film, formed as the interlayer film by reaction of $TEOS+O_3$, than the silicon containing insulating films 5, 7 formed by reaction of $SiH_4+N_2O$.

Namely, when the silicon oxide film formed by the thermal CVD method is formed on the silicon containing insulating film formed from the $TEOS/O_2$ reaction system, the rate of forming the film is lower than that of forming the silicon oxide film directly on the silicon substrate and, therefore, unevenness in thickness occurs. Thus, anomalous growth of the silicon oxide film by the thermal CVD method is readily caused.

In addition, when a silicon oxide film is formed by the thermal CVD method on the silicon containing insulating film from a reaction gas of $TEOS/O_2$, the step coverage by the silicon oxide film becomes poor. As a result, voids are often formed in the recesses between the interconnection layers etc., which are covered by such silicon containing insulating film.

SUMMARY OF THE INVENTION

An object of the present invention is to provide a method of forming a film by means of the plasma CVD method using a highly safe reaction gas, the method being capable of forming a dense film which is low in moisture and organic residue such as carbon, which has excellent step coverage, which can conform to the silicon oxide film formed by the thermal CVD method, and which allows for control of the refractive index and stress etc. of the formed insulating film.

In the present invention, a gaseous mixture of an organic compound having Si-H bonds and an oxidizing gas is used as the reaction gas in the plasma CVD method.

Organic compounds having Si-H bonds such as alkylsilanes, arylsilanes, alkoxysilanes, chain siloxanes and ring siloxanes are not as reactive as $SiH_4$, and thus are safer to use. Such organic compounds are in the liquid state at room temperature and thus are easy to handle.

The Si-H bonds included in the reaction gas serve to absorb oxygen, generated by plasma decomposition, and $O_2$ and $N_2O$ in the oxidizing gas. As a result, the formed insulating film becomes oxygen deficient. Under this condition, since Si is present in excess in the insulating film, the insulating film is dense. Thus, the refractive index can be varied according to the amount of Si. By bringing the insulating film into a Si-excessive condition, affinity of the insulating film for the silicon oxide film formed by the thermal CVD method using the mixed gas of $TEOS+O_3$ can be improved.

Furthermore, when a gas including nitrogen is used as the oxidizing gas, the refractive index and stress etc. of the formed insulating film can be controlled by adjusting the amount of nitrogen contained in the formed insulating film.

Experimental results show that the insulating film formed by the plasma CVD method, using the above reaction gas, contains low moisture and organic residues such as carbon, and provides good step coverage.

The following are organic compounds having Si-H bonds which exemplify compounds providing the above advantages:

1. Alkylsilane and arylsilanes: $R_nSiH_{4-n}$ (n=1 to 3)
2. Alkoxysilanes: $(RO)_nSiH_{4-n}$ (n=1 to 3)
3. Chain siloxanes: $R_nH_{3-n}SiO (R_kH_{2-k}SiO)_mSiH_{3-n}R_n$ (n=1, 2; k=0 to 2; m≧0)
4. Ring siloxanes: $(R_kH_{2-k}SiO)_m$ (k=1; m≧2) wherein R denotes an alkyl group, an aryl group or derivative thereof in each general formula.

The following, which are suitable for combining with the above organic compounds, can be used as the oxidizing gas. That is, $O_2$ or $N_2O$ is mainly used for the organic compounds in the above category 1, and $N_2O$ is mainly used for the organic compounds in the above categories 2 to 4.

Oxidizing gases include $NO_2$, $CO$, $CO_2$, $H_2O$ and the like, in addition to $O_2$ and $N_2O$. The above organic compound is combined with at least one of these gases. There are 83 possible combinations of the 6 listed oxidizing gases, and any one of the above organic compounds can be combined with any one of these combinations.

As described above, the forming of the film by the plasma CVD method, according to the present invention, employs a highly safe reaction gas and provides a dense silicon containing insulating film low in moisture and organic residues such as carbon, having excellent step coverage, and having good affinity to a silicon oxide film formed by the thermal CVD method. Further, the present invention allows for control of the refractive index, etc. of the silicon containing insulating film.

DESCRIPTION OF THE PREFERRED EMBODIMENTS (1) The CVD Reactants

Suitable organic compounds having Si-H bonds include:

(A) Alkylsilane or arylsilane: $R_nSiH_{4-n}$ (n=1 to 3) wherein R is an alkyl group, aryl group or derivative thereof. The alkyl group is expressed by the general formula $C_nH_{2n+1}$. "Aryl" is a generic term for the residue obtained by removing one hydrogen atom from the nucleus of an aromatic hydrocarbon. Suitable aryl groups include phenyl $C_6H_5$—derived from benzene, tolyl $CH_3C_6H_4$—derived from toluene, xylyl $(CH_3)_2C_6H_3$—derived from xylene, and naphthyl $C_{10}H_4$—derived from naphthalene. The derivatives are organic compounds generated by changes in small portions of the molecules of the aforementioned organic compounds.

It is preferable that the range of n of the alkyl group $C_nH_{2n+1}$ be below 5. In particular, it is optimum in respect of vapor pressure that n is 1 or 2.

A preferred embodiment of the alkylsilane is shown in Table 1.

TABLE 1

| molecular formula | boiling point(°C.) | melting point(°C.) |
|---|---|---|
| $(CH_3)_2SiH(C_2H_5)$ | 46 | — |

Preferred embodiments of derivatives of alkylsilane are shown in Table 2.

TABLE 2

| molecular formula | boiling point(°C.) | melting point(°C.) |
|---|---|---|
| $CH_3SiH(Cl)_2$ | 41–42 | −93 |
| $(CH_3)_2SiH(Cl)$ | 36 | −111 |
| $CH_3SiH(C_2H_5)Cl$ | 67–68 | — |
| $(C_2H_5)_2SiH(Cl)$ | 143(1.3) | −157 |

Preferred embodiments of the aryl silane are listed in Table 3.

TABLE 3

| molecular formula | boiling point(°C.) | melting point(°C.) |
|---|---|---|
| $C_6H_5SiH_3$ | 120 | — |
| $(C_6H_5)_2SiH_2$ | 100–101(4) | — |
| $(C_6H_5)_3SiH$ | 160–165(0.4) | 42.44 |
| $CH_3(C_6H_5)SiH_2$ | 139 | — |

Preferred embodiments of aryl silane derivatives are listed in Table 4.

TABLE 4

| molecular formula | boiling point(°C.) | melting point(°C.) |
|---|---|---|
| $(C_6H_5)SiH(Cl)$ | 143(1.3) | — |
| $C_6H_5SiH(CH_3)Cl$ | 113(13) | 1.054 |

(b) Alkoxysilane: $(RO)_nSiH_{4-n}$ (n=1–3)
Wherein R denotes an alkyl group, aryl group or a derivative thereof.
Preferred alkoxysilanes are:
① Trimethoxysilane: $(CH_3O)_3SiH$
Trimethoxysilane is a colorless, transparent liquid having a molecular weight of 122.2 and a boiling point of 86!n. It has an inflammability, but it does not have explosive and hypergolic property like $SiH_4$. Thus, it can be handled in the same manner as TEOS.
Trimethoxysilane has the formula:

② Triethoxysilane: $(C_2H_5O)_3SiH$
Triethoxysilane has a boiling point of 131.5° C. and a melting point of −170° C., and has the formula:

Preferred alkoxysilanes and derivatives are listed in Table 5.

TABLE 5

| molecular formula | boiling point(°C.) | melting point(°C.) |
|---|---|---|
| $(CH_3O)_3SiH$ | 86–87 | — |
| $(C_2H_5O)_3SiH$ | 131.5 | −170 |

(C) Chain siloxanes: $R_nH_{3-n}SiO(R_kH_{2-k}SiO)_mSiH_{3-n}R_n$ (n=1, 2; k=0–2; m≧0)
wherein R denotes an alkyl group, aryl group or a derivative thereof.

(a) Disiloxanes: $R_nH_{3-n}SiOSiH_{3-n}R_n$ (n=1, 2)
Disiloxane corresponds to the case where m=0 in the above general formula for the chain siloxanes. Derivatives of the disiloxane are represented by the general formula $(RO)_nH_{3-n}SiOSiH_{3-n}(OR)_n$ (n=1, 2), wherein R is an alkyl group or aryl group.
Preferred embodiments of the disiloxanes are:
① Tetramethyldisiloxane: $(CH_3)_2HSiOSiH(CH_3)_2$
Tetramethyldisiloxane has a boiling point of 70°–71° C., and the following formula:

② Tetraethyldisiloxane: $(C_2H_5)_2HSiOSiH(C_2H_5)_2$
Tetraethyldisiloxane has the following formula:

Preferred embodiments of the derivatives of the disiloxane are represented by the following formulae:

(b) Chain siloxanes: $R_nH_{3-n}SiO(R_kH_{2-k}SiO)_mSiH_{3-n}R_{n(n=1, 2; k=0-2; m≧1)}$
Preferred embodiments of chain siloxanes other than the disiloxane are:
① Trimethyltrisiloxane: $(CH_3)H_2SiO((CH_3)HSiO)SiH_2(CH_3)$
Trimethyltrisiloxane has the formula:

② Pentamethyltrisiloxane: $(CH_3)_2HSiO((CH_3)HSiO)SiH(CH_3)_2$
Pentamethyltrisiloxane has the following formula:

③ Triethyltrisiloxane: $(C_2H_5)H_2SiO((C_2H_5)HSiO)SiH_2(C_2H_5)$

Triethyltrisiloxane has the following formula:

④ Pentaethyltrisiloxane: $(C_2H_5)H_2SiO((C_2H_5)HSiO)SiH_2(C_2H_5)_2$

Pentaethyltrisiloxane has the following formula:

(D) Ring siloxanes: $(R_kH_{2-k}SiO)_m$ (k=1; m≧2)

Wherein R is an alkyl group, aryl group or derivative thereof.

Preferred embodiments of the ring siloxanes are:

① TMCTS: $((CH_3)HSiO)_4$

TMCTS has a boiling point of 134°–135° C. and a melting point of –69° C., and the following formula:

② TECTS: $((C_2H_5)HSiO)_4$
TECTS has a the formula:

Organic compounds having Si-H bonds, that is, alkylsilanes, arylsilanes, alkoxysilanes and siloxanes, as mentioned above, are not as reactive as SiH and have high safety. They are mainly in liquid phase at room temperature so that they are easy to handle.

(ii) Examples of the reaction admixtures obtained by combining each of the above organic compounds with an oxidizing gas are:

(A) Reaction gases obtained by adding $O_2$ or $N_2O$ to the organic compounds listed under (i)(A) above, (B) Reaction gases obtained by adding $N_2O$ to the organic compounds listed under (i)(B) above, (C) Reaction gases obtained by adding $N_2O$ to the organic compounds listed under (i)(C) above, (D) Reaction gases obtained by adding $N_2O$ to the organic compounds listed under (i)(D) above, As the oxidizing gas, $NO_2$, CO, $CO_2$ and $H_2O$ can be used, in addition to $O_2$ and $N_2O$. At least one of these oxidizing gases can be utilized by being combined with one of the organic compounds listed under the above headings (i)(A) to (D). Reaction gases of 83 types can be realized as combinations of the six kinds of the reaction gases. Any one of these reaction gas combinations can be combined with any one of the above organic compounds.

The Plasma CVD Apparatus

Figure 3:
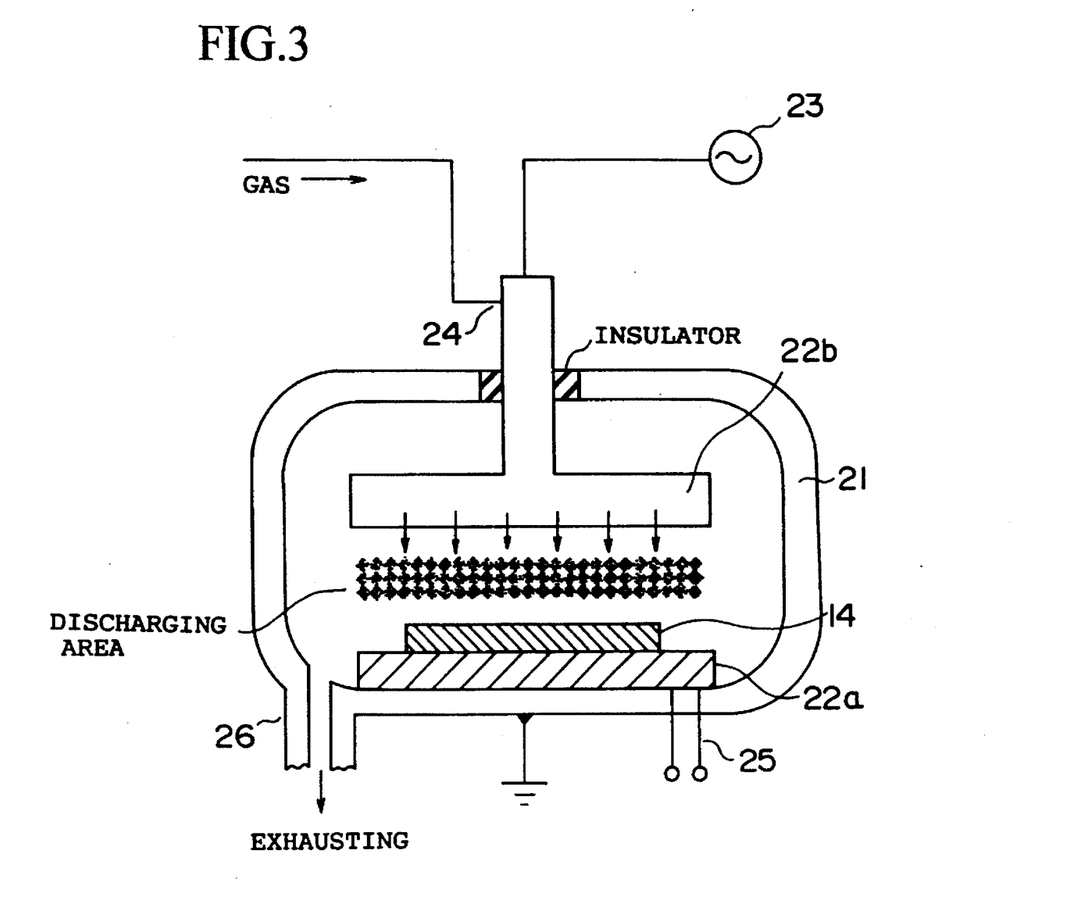
FIG. 3 is a side view, partially in cross-section, of a plasma CVD apparatus used in the method of forming the film according to an embodiment of the present invention.

FIG. 3 is a side view showing the structure of the parallel plate type plasma CVD apparatus used in the method of forming the insulating film according to an embodiment of the present invention.

In FIG. 3, numeral 21 denotes a chamber, and numerals 22a, 22b denote a pair of electrodes opposing each other. When the high frequency electric power (RF electric power) is applied to the electrodes 22a, 22b, the reaction gas introduced into the space between the electrodes 22a, 22b is converted to a plasma.

The electrode 22a, which is grounded, also serves as a table supporting the deposition substrate 14.

The electrode 22b, to which the high frequency power supply (RF power supply) is connected, also serves as a distributor for the reaction gas. The reaction gas is introduced from a gas inlet 24 connected to the distributor 22b.

The electrode 22a has a built-in heater (not shown) for heating the deposition substrate 14, and a power supply is connected to the Dower supplying interconnections 25 for the heater.

An exhaust port 26 is connected to an exhausting apparatus (not shown) so as to exhaust spent gas and unreacted reaction gas and to keep the interior of the chamber 21 at a predetermined pressure.

The Film-forming Method

FIGS. 2A to 2D are cross sectional views showing the formation of the film by the plasma CVD method according to the first embodiment of the present invention.

A parallel plate type plasma CVD apparatus is used as the plasma CVD apparatus and trimethoxysilane $(CH_3O)_3SiH$ is used as the reaction gas in the following.

Figure 2A:
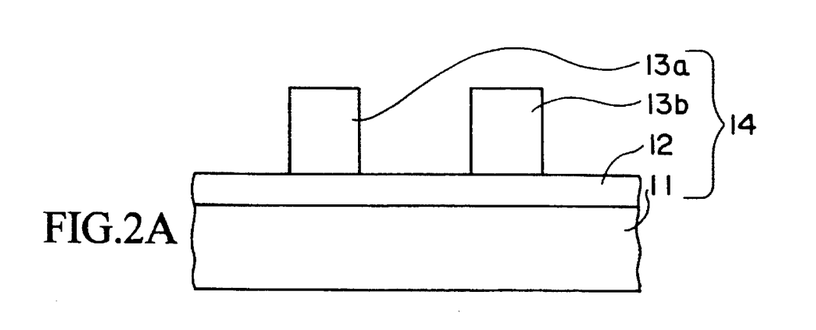
FIGS. 2A to 2D are cross-sectional schematic views showing a method of forming an insulating film according to a first embodiment of the present invention.

FIG. 2A is a cross-sectional view showing a structure after the interconnection layers are formed and before the silicon containing insulating film is formed by the plasma CVD method. In FIG. 2A, 11 denotes the silicon substrate; 12, a backing insulating film made of silicon oxide formed on the silicon substrate 11; and 13a, 13b, interconnection layers formed on the backing insulating film 12 adjacent to each other and spaced at a predetermined distance. Together, 11, 12, 13a and 13b constitute a deposition substrate 14.

The deposition substrate 14 is placed on the electrode 22a in the chamber 21, and then the pressure of the interior of the chamber 21 is reduced. The deposition substrate 14 is then heated and held within a temperature range 300° to 400° C.

Next, liquid trimethoxysilane at a temperature of 10° C. is vaporized by bubbling argon gas (carrier gas) therethrough at a flow rate of 100 SCCM so that argon gas including trimethoxysilane is generated. A predetermined flow rate of $N_2O$ gas is added as the oxidizing gas to the resultant argon gas, and then the mixed gas is introduced into the chamber 21 through the gas inlet. At this time, the pressure in the chamber 21 is held at about 1 Torr. The flow rate of $N_2O$ gas was varied.

Then, high frequency electric power at 13.56 MHz or 100 kHz and 400 W is supplied to the electrodes 22a, 22b. As a result, the reaction gas between the electrodes 22a, 22b is converted to a plasma.

Figure 2B:
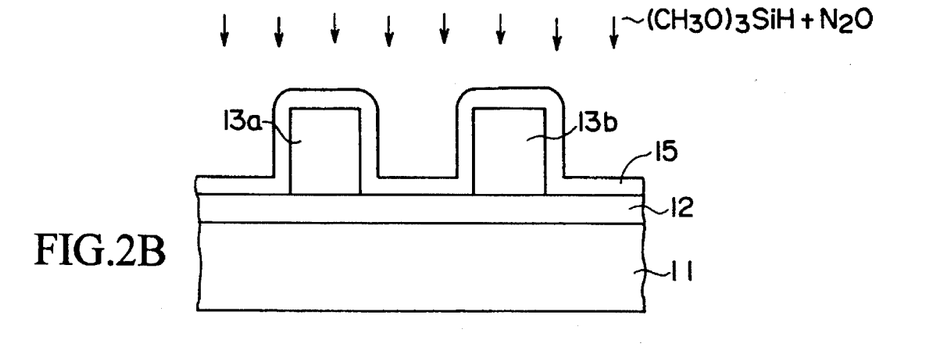

$N_2O$ is dissociated into activated nitrogen N* and activated oxygen O* in the plasma, and these activated species react with the Si-H bonds. As shown in FIG. 2B, a $SiO_xN_y$ film (silicon containing insulating film) is formed to cover the interconnection layers 13a, 13b.

The Si-H bonds included in the reaction gas serve to react with the oxygen generated in the plasma or with gases such as $O_2$ and $N_2O$ in the oxidizing gas. As a result, the $SiO_xN_y$ film 15 becomes oxygen deficient. Under this condition, since Si is contained in excess in the $SiO_xN_y$ film 15, the $SiO_xN_y$ film 15 is dense. Thus the refractive index can be varied according to the amount of Si. By bringing the insulating film into Si-excess condition, affinity of the insulating film for the silicon oxide film formed by thermal CVD from a gaseous mixture of TEOS+$O_3$ can be improved.

Furthermore, when a gas including nitrogen is used as the oxidizing gas, the refractive index and stress etc. of the formed $SiO_xN_y$ film 15 can be controlled by adjusting the amount of nitrogen contained in the $SiO_xN_y$ film 15.

Like an insulating film formed by the plasma CVD method using TEOS+$O_2$, the $SiO_xN_y$ film 15 also has good step coverage.

Figure 2C:
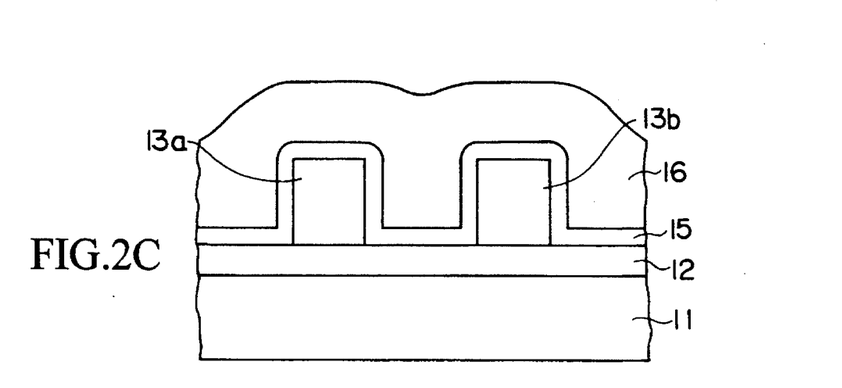

As shown in FIG. 2C, a silicon oxide film 16 is next formed on the $SiO_xN_y$ film 15 by the thermal CVD method. For this purpose, the deposition substrate 14 is placed in a normal pressure atmosphere. While the temperature of the substrate 14 is kept at about 400° C., the reaction gas, which is obtained by adding $O_3$ and $O_2$ gas (6% $O_3$) to the TEOS carried by the carrier gas, is introduced. The reaction gas is thermally decomposed to form a silicon oxide film 16 on the $SiO_xN_y$ film 15. Since the backing $SiO_xN_y$ film 15 has good affinity for the silicon oxide film 16 formed by the thermal CVD method using the mixed gas of TEOS+$O_3$, the rate of forming the silicon oxide film 16 is uniform. As a result, abnormal growth of the silicon oxide film 16 can be suppressed, and the silicon oxide film 16 has good step coverage.

Figure 2D:
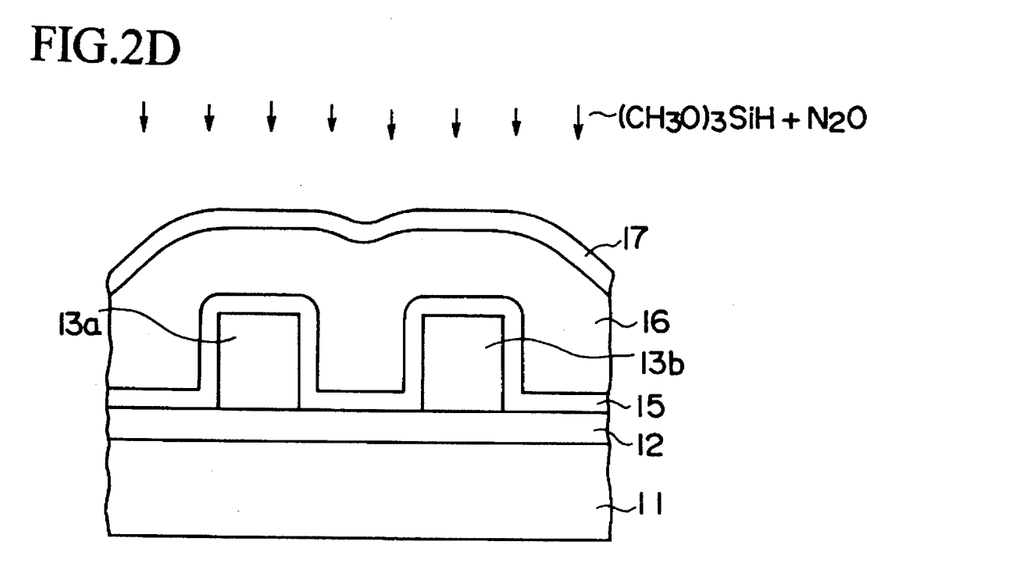

Thereafter, as shown in FIG. 2D, the $SiO_xN_y$ film (silicon containing insulating film) 17 is formed on the silicon oxide film 16 by the plasma CVD method under the same conditions as above. Thus an interlayer insulating film having a three layered structure is formed.

Subsequently, film forming rate, refractive index, amount of moisture and stress of the formed $SiO_xN_y$ films 15, 17 were examined with the results which follow.

The silicon containing insulating films ($SiO_xN_y$ films) 15, 17 were formed under the following conditions.

Reaction gas: $(CH_3O)_3SiH(Ar)+N_2O$
Gas pressure: 1 Torr
Temperature of substrate: 400° C.
RF frequency: 13.56 MHz
RF electric power: 400 W
Refractive index: 1.493

The silicon oxide film 16 was formed under the following conditions.

Reaction gas: TEOS($N_2$)+$O_3$/$O_2$ ($O_3$ concentration is 6%)
Gas pressure: atmospheric pressure
Temperature of substrate: 400° C.

[Film Forming Rate]
800–1500 Å/min

According to the stress measurement, the film formed by application of electric power at 13.56 MHz has a stress of 5–10×$10^8$ dyne/cm$^2$ (tensile stress), and the film formed by application of electric power at 100 kHz has a stress of 5–10×$10^8$ dyne/cm$^2$ (compressive stress).

It is noted that the stress changes in accordance with the frequency of the electric power used to form the plasma. It can be seen that the quality of the film, having compressive stress, is dense.

Based on the above result, it is preferable that the applied frequency used to form the reaction gas plasma is 100 kHz.

Figure 4:
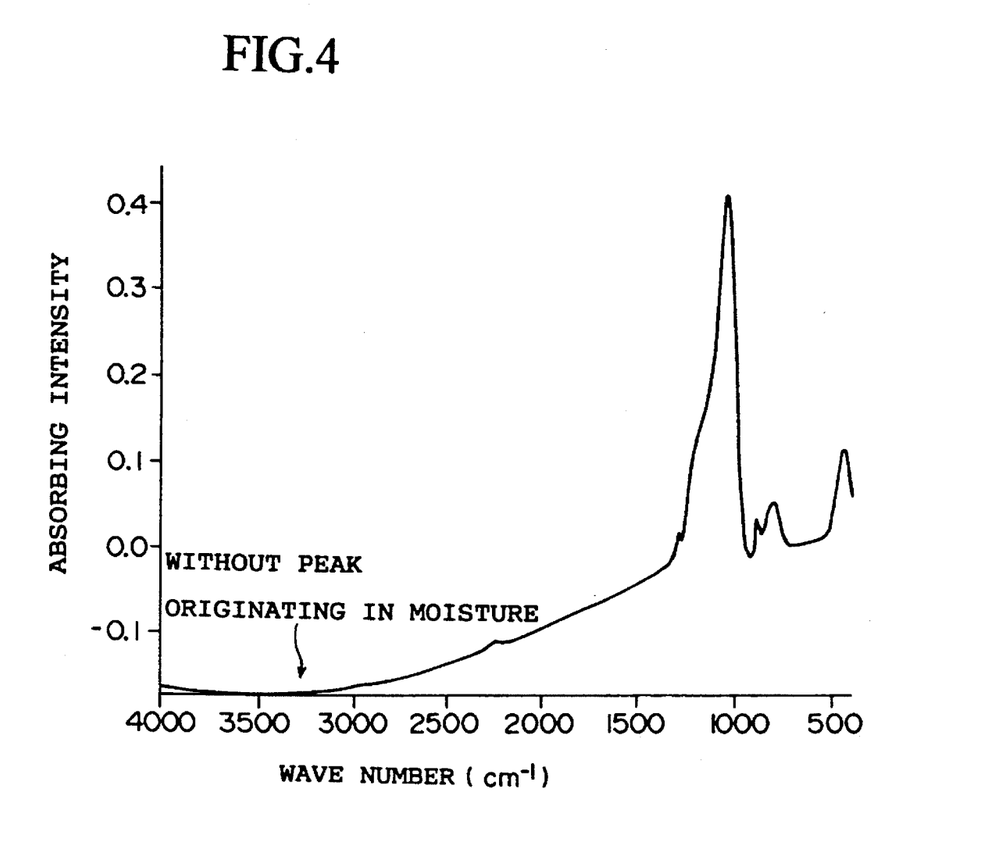
FIG. 4 is a graph of the infrared spectrum for an insulating film formed in accordance with the present invention and illustrating a low moisture content in the silicon-containing insulating film.

FIG. 4 is a view showing the amount of moisture in the $SiO_xN_y$ films 15, 17 examined by the infrared absorption spectrum method.

In FIG. 4, the ordinate axis denotes the absorption strength shown in proportional scale, and the abscissa axis denotes the wave number (cm$^{-1}$) shown in proportional scale. No peak indicating moisture appears. Thus, it is noted that the amount of moisture contained in the $SiO_xN_y$ films 15, 17 is extremely small.

Figure 5:
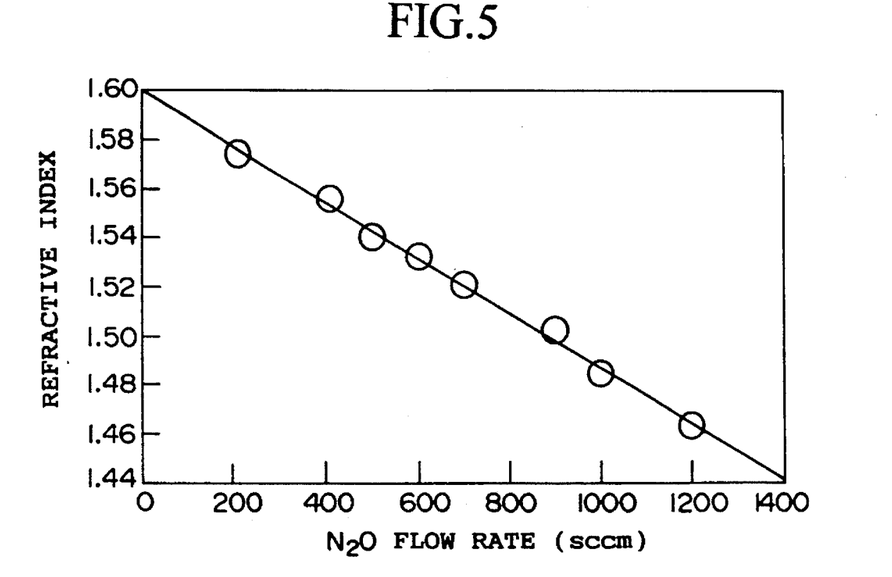
FIG. 5 is a graph of the refractive index (ordinate) of the silicon containing insulating film formed by the method of the present invention versus flow rate of $N_2O$ (abscissa)

FIG. 5 is a graph illustrating the dependency of the refractive index of the $SiO_xN_y$ films 15, 17 upon the flow rate of the $N_2O$ containing gas. The magnitude of the refractive index is used as a criterion for evaluating the denseness of the film, and is also used as a criterion for evaluating the affinity to the silicon oxide film by the thermal CVD method.

In FIG. 5, the ordinate axis denotes the refractive index shown in proportional scale, and the abscissa axis denotes the flow rate of $N_2O$ containing gas (SCCM) shown in proportional scale.

It can be seen from the result that the refractive index was inversely proportional to the flow amount of $N_2O$ containing gas and that the refractive index changed from almost 1.58 to 1.46 with change in the flow rate from 200 to 1200 SCCM. Thus the refractive index can be controlled by adjusting the flow rate of $N_2O$ containing gas. The higher the refractive index becomes, the denser the film becomes. As described hereinbelow, the affinity to the silicon oxide film 16 formed by the thermal CVD method also increases.

Figure 6:
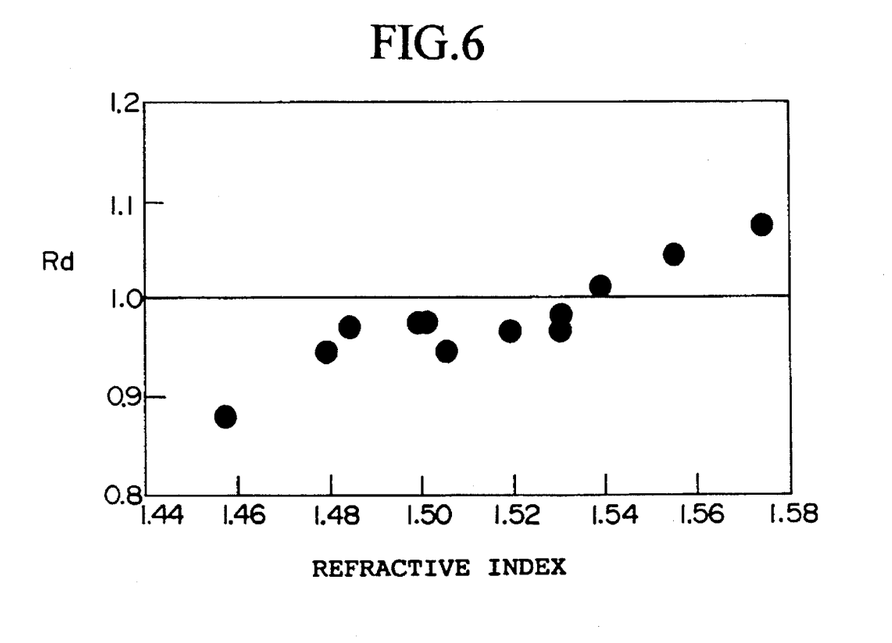
FIG. 6 is a graph of the film forming rate (Rd) (ordinate) of the silicon containing insulating film formed by the method of the present invention versus refractive index (abscissa)

FIG. 6 is a graph illustrating the effect of the film forming rate of the silicon oxide film, formed by the thermal CVD method, upon the refractive index. By evaluating a ratio of (1) the film forming rate (Rd) of the silicon oxide film 16, formed by the thermal CVD method on the $SiO_xN_y$ film 15 formed by the plasma CVD method, to (2) the film forming rate of the silicon oxide film formed by the thermal CVD method when it is formed directly on the silicon substrate, the affinity of the $SiO_xN_y$ film 15 formed by the plasma CVD method to the silicon oxide film 16 formed by the thermal CVD method can also be evaluated. It can be seen that as Rd becomes close to 1, good affinity is obtained.

In FIG. 6, the ordinate axis denotes the ratio of the film forming rate (Rd) shown in proportional scale, and the abscissa axis denotes the refractive index shown in proportional scale. According to the results, a ratio of the film forming rate of about 0.9 gives about 1.46 for the refractive index, a ratio of the film forming rate about 1 gives a range of about 1.48 to 1.56 for the refractive index, and the ratio of the film forming rate of close to 1.1 gives 1.58 for the refractive index. It can be inferred from this fact that, in contrast to the $SiO_2$ film obtained by using the mixed gas of TEOS+$O_2$, the affinity can be extremely improved and is as high as the $SiO_xN_y$ film obtained by using the mixed gas of $SiH_4+N_2O$.

As described above, according to the present invention, the Si-H bonds included in the reaction gas serve to absorb oxygen generated by the plasma or gas such as $O_2$ and $N_2O$ in the oxidizing gas. As a result, the formed silicon containing insulating films 15, 17 become short of oxygen. Under this condition, since Si atoms are contained in excess in the silicon-containing insulating films 15, 17, the quality of the silicon containing insulating films 15, 17 become dense. Thus the refractive index can be varied according to the amount of Si atoms. By bringing the insulating film into a Si-excessive condition, affinity of the insulating film to the silicon oxide film 16, formed by the thermal CVD method using the mixed gas of TEOS+$O_3$, can be improved.

Furthermore, when a gas including nitrogen is used as the oxidizing gas, the refractive index and the stress etc. of the formed $SiO_xN_y$, film 15 can be controlled by adjusting the amount of nitrogen contained in the formed silicon containing insulating films 15, 17.

The silicon-containing insulating films 15, 17 formed by the plasma CVD method using the above reaction gas contain low amounts of organic compounds, moisture, carbon etc., and have good step coverage.

With the above method of forming the film with the plasma CVD method according to the present invention, using a high safety reaction gas, the silicon containing insulating films 15, 17, which are dense and have only a small amount of organic residues, moisture, carbon etc., and have good step coverage, can be formed. The refractive index and other properties of the formed silicon containing insulating films 15, 17 can also be controlled.

(B) Second embodiment

In the method of forming the film by the plasma CVD method according to the second embodiment, an interlayer insulating film having the same three layered structure as that of the first embodiment is formed using triethoxysilane $(C_2H_5O)_3SiH$ as the reaction gas.

The silicon containing insulating films ($SiO_xN_y$ films) were formed under the following conditions.
Reaction gas: $(C_2H_5O)_3SiH(Ar)+N_2O$
Gas pressure: 1 Torr
Temperature of substrate: 400° C.
RF frequency: 13.56 MHz
RF electric power: 400 W
Refractive index: 1.493

The silicon oxide film was formed under the following conditions.
Reaction gas: $TEOS(N_2)+O_3/O_2$ ($O_3$ concentration is 6%)
Gas pressure: atmospheric pressure
Temperature of substrate: 400° C.

In the second embodiment, like the first embodiment, using high safety reaction gas, the silicon containing insulating films which have dense film quality and have low amounts of organic residues, moisture, carbon etc., and good step coverage can be formed. The refractive index and other properties of the formed silicon-containing insulating films can also be controlled.

(C) Third embodiment

In the method of forming the film by the plasma CVD method according to the third embodiment of the present invention, an interlayer insulating film having the same structure as that of the first embodiment is formed using tetramethyldisiloxane $(CH_3)_2HSiOSiH(CH_3)_2$ as the reaction gas.

The silicon-containing insulating films ($SiO_xN_y$ films) were formed under the following conditions. Other conditions are identical to those conditions described above.
Reaction gas: $(CH_3)_2HSiOSiH(CH_3)_2(Ar)+N_2O$
Gas pressure: 1 Torr
Temperature of substrate: 400° C.
RF frequency: 13.56 MHz
RF electric power: 400 W
Refractive index: 1.493

Also the silicon oxide film was formed under the following conditions. Other conditions are identical to those conditions described above.
Reaction gas: $TEOS(N_2)+O_3/O_2$ ($O_3$ concentration is 6%)
Gas pressure: atmospheric pressure
Temperature of substrate: 400° C.

In the third embodiment, like the first embodiment, using a highly safe reaction gas, the silicon-containing insulating films which have dense film quality, have low amounts of organic residues, moisture, carbon etc., and have good step coverage can be formed. The refractive index and other properties of the formed silicon-containing insulating films can also be controlled.

(iii) Comparison examples (A) First comparison example

Figure 7A:
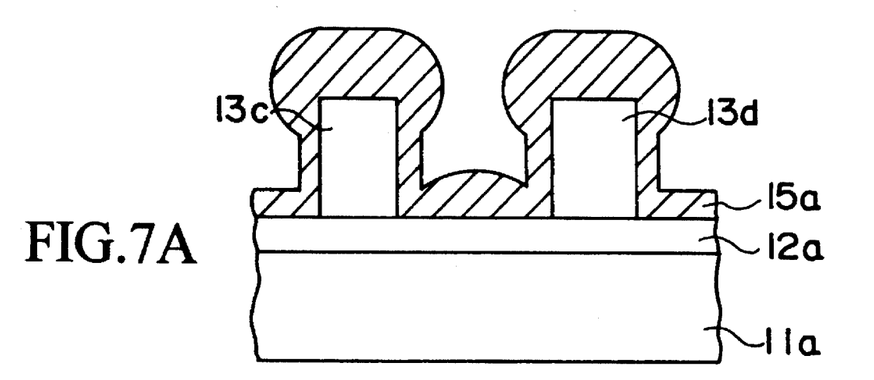
FIG. 7A is a schematic cross-sectional view of a $SiO_xN_y$ film formed by the plasma CVD method using a mixed gas of $SiH_4+N_2O$ according to a first example.
Figure 8A:
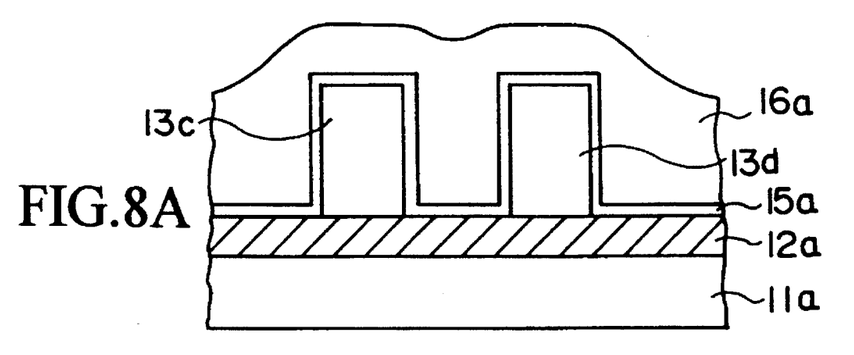
FIG. 8A is a schematic cross-sectional view showing a silicon oxide film formed by the thermal CVD method using a mixed gas of $TEOS+O_3$, formed on the $SiO_xN_y$ film shown in FIG. 7A according to the first example.

FIG. 7A is a cross-sectional view showing the $SiO_xNy$ film 15a formed by the plasma CVD method using a mixed gas of $SiH_4+N_2O$. The sectional shape of the $SiO_xN_y$ film 15a is emphasized. FIG. 8A shows a cross-section of the silicon oxide film 16a formed on the $SiO_xN_y$ film 15a by the thermal CVD method using the mixed gas of $TEOS+O_3$.

The silicon-containing insulating film ($SiO_xN_y$ film) was formed under the following conditions:
Reaction gas: mixed gas of $SiH_4+N_2O$
Gas pressure: 1 Torr
Temperature of substrate: 400° C.
RF frequency: 13.56 MHz
RF electric power: 400 W
Refractive index: 1.493

Also the silicon oxide film 16a was formed under the following conditions.
Reaction gas: TEOS $(N_2)+O_3/O_2$ ($O_3$ concentration is 6%)
Gas pressure: atmospheric pressure
Temperature of substrate: 400° C.

As shown in FIG. 7A, the cross-sectional shape of the silicon-containing insulating film 15a does not show leveling but, rather, is a mushroom shape with the insulating film 15a deposited more thickly on the upper sidewalls of the interconnection layers 13c, 13d. Accordingly, void precursors are formed in the recesses between the interconnection layers 13c, 13d as the interconnection layers 13c, 13d become narrow.

Figure 9:
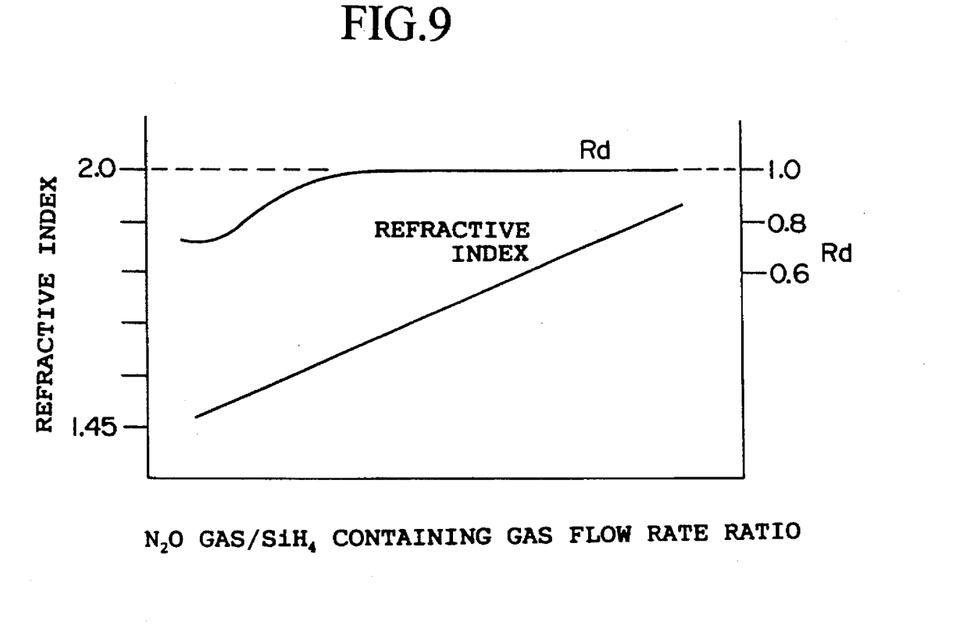
FIG. 9 is a graph of the refractive index and the film forming rate (Rd) of the silicon containing insulating film according to the first example versus the ratio of $N_2O$ flow rate to $SiH_4$ flow rate.

In FIG. 9, the left side ordinate denotes the refractive index in proportional scale and the right side ordinate denotes the ratio of the film forming rate in proportional scale, and the abscissa denotes a ratio of flow rate of $N_2O$ gas/flow rate of $SiH_4$ containing gas in proportional scale.

As can be seen in FIG. 9, the film forming rate is almost 0.8 and the affinity to the silicon oxide film 16a by the thermal CVD film formed from the mixed gas of $TEOS+O_3$ is low if the ratio of flow rate of $N_2O$ gas/flow rate of $SiH_4$ containing gas is small, but the film forming rate becomes almost 1 and the affinity to the silicon oxide film 16a becomes higher as the ratio of flow rate increases. As a result, as shown in FIG. 8A, the silicon oxide film 16a has better leveling, and the step coverage can be improved.

(B) Second comparison example

Figure 7B:
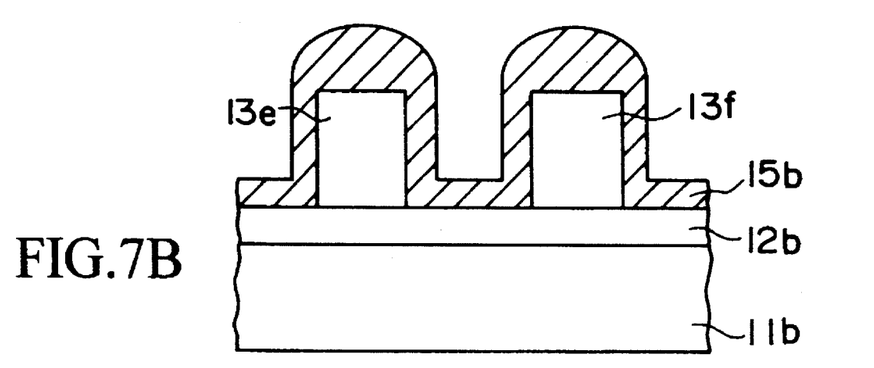
FIG. 7B is a schematic cross-sectional view of the silicon oxide film formed by the plasma CVD method using the mixed gas of $SiH_4+N_2O$ according to a second example.

FIG. 7B is a cross-sectional view of a structure obtained after the silicon oxide film ($SiO_2$ film) 15b is formed by the plasma CVD method using the mixed gas of $TEOS+O_2$. Especially, the sectional shape of the silicon oxide film 15b is illustrated with emphasis.

Figure 8B:
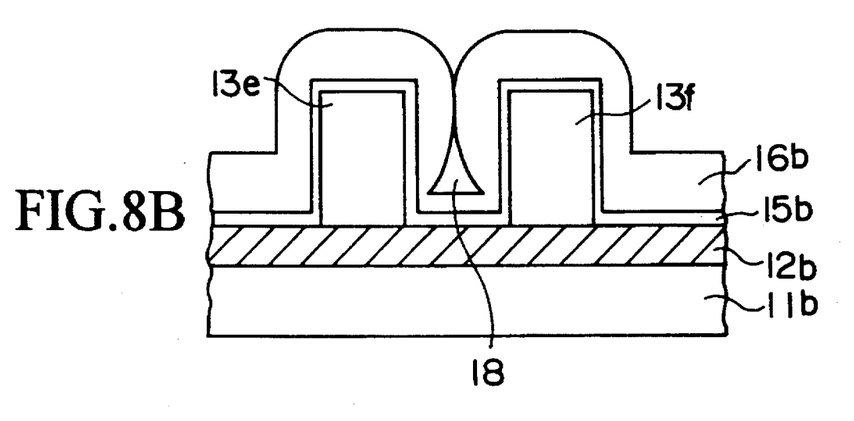
FIG. 8B is a schematic cross-sectional view of the silicon oxide film formed by the thermal CVD method using the mixed gas of $TEOS+O_3$, formed on the $SiO_xN_y$ film shown in FIG. 7B according to the second example.

FIG. 8B is a cross-sectional view showing a structure obtained after the silicon oxide film 16b is formed on the silicon oxide film 15b by the thermal CVD method using the mixed gas of $TEOS+O_3$. Especially, the sectional shape of the silicon oxide film 16b is illustrated with emphasis.

The silicon oxide film ($SiO_2$ film) 15b was formed under the following conditions.
Reaction gas: mixed gas of $TEOS+O_2$
Gas pressure: 1 Torr
Temperature of substrate: 400° C.
RF frequency: 13.56 MHz
RF electric power: 400 W
Refractive index: 1.493

Also the silicon oxide film 16b was formed under the following conditions.
Reaction gas: $TEOS(N_2)+O_3/O_2$ ($O_3$ concentration is 6%)
Gas pressure: atmospheric pressure
Temperature of substrate: 400° C.

As shown in FIG. 7B, the cross-sectional shape of the silicon oxide film 15b does not level as in the case where mixed gas of $SiH_4+N_2O$ is used. But, unlike the case where the mixed gas of $SiH_4+N_2O$ is used, the silicon oxide film 15b has the same thickness on both the side walls of the interconnection layers 13e, 13f and the backing insulating film 12b and, therefore, does not show abnormal growth. Consequently, even if the interconnection layers 13e, 13f become narrow, voids in the recesses between the interconnection layers 13e, 13f tend not to form.

Figure 10:
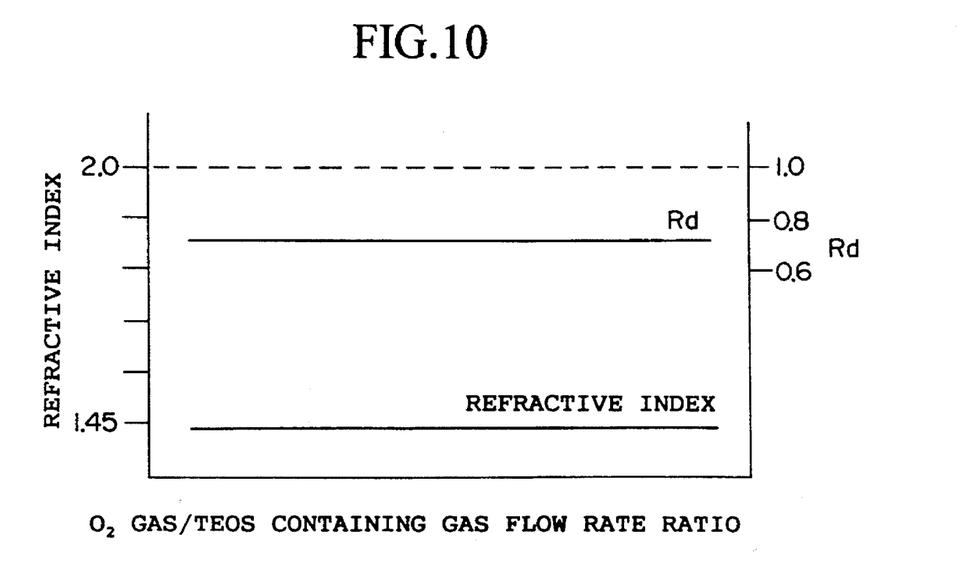
FIG. 10 is a graph of the refractive index and the film forming rate of the silicon containing insulating film according to the second example versus the ratio of flow rate of $O_2$ to flow rate of TEOS containing gas.

FIG. 10 is a view showing dependency of the refractive index and the ratio of the film forming rates (Rd) upon the the ratio of $O_2$ gas/TEOS containing gas.

In FIG. 10, the left side ordinate denotes the refractive index in proportional scale, the right side ordinate denotes the ratio of film forming rate in proportional scale, and the abscissa denotes the ratio of $O_2$ gas/TEOS containing gas in proportional scale.

FIG. 10 shows that, irrespective of the ratio of $O_2$ gas/ $SiH_4$ containing gas, the film forming rate is almost 0.8 which is considerably smaller than 1, and that the affinity to the silicon oxide film 16b formed by the thermal CVD method using the mixed gas of $TEOS+O_3$ is low.

Therefore, as shown in FIG. 8B, when the silicon oxide film 16b is formed by the thermal CVD method using the mixed gas of $TEOS+O_3$ on the silicon oxide film 15b, which covers the interconnection layers 13e, 13f, the silicon oxide film 16b does not level and therefore voids readily occur in the recesses between the interconnection layers 13e, 13f. On the contrary, in the case shown in FIG. 2C representative of the present invention, the silicon oxide film 16 has good leveling and excellent step coverage.

By summarizing the above results into Table 6, the characteristics of the silicon-containing insulating film 15 or 17 according to the first embodiment can be compared with the characteristics of the silicon-containing insulating films 15a according to the above first comparison example and the silicon oxide film 15b according to the second comparison example.

TABLE 6

| | first embodiment | first comparison | second comparison |
| --- | --- | --- | --- |
| density of film (denseness) | high | high | low |
| film quality on side wall | good (same as on plane) | good | unstable |
| refractive index | variable | variable | invariable (constant) |
| carbon impurity | none or little | nothing | high |
| moisture | low | extremely low | high |
| moisture permeability | low | low | high |
| step coverage | good | bad | good |
| stress | stable | stable (no change with time) | unstable (change with time) |
| affinity to TEOS/$O_3$ APCVD NSG (surface dependency) | good (Rd = 0.7–0.8) | good (Rd = 1.0) | unstable (Rd = 0.7–1.0) |
| safety | high | low | high |

What is claimed is:

1. A method of forming a silicon device comprising:
    (a) forming a plasma from a gas containing at least one organic compound having Si-H bonds and an oxidizing gas;
    (b) contacting a deposition substrate with said plasma to form a silicon-containing insulating film as a backing layer on the substrate; and
    (c) coating said backing layer with a layer of silicon oxide by thermal CVD.

2. The method of forming an insulating film according to claim 1, wherein said organic compound having Si-H bonds is selected from the group consisting of alkylsilanes, arylsilanes, alkoxysilanes and siloxanes.

3. The method of forming an insulating film according to claim 2, wherein said alkylsilanes and arylsilanes are represented by the general formula $R_nSiH_{4-n}$ (n=1 to 3), and said R is a member selected from the group consisting of alkyl, aryl and their derivatives.

4. The method of forming an insulating film according to claim 2, wherein said organic compound containing Si-H bonds is an alkoxysilane and said alkoxysilane is expressed by a general formula $(RO)_nSiH_{4-n}$ (n=1 to 3), wherein R is alkyl or a derivative thereof.

5. The method of forming an insulating film according to claim 2, wherein said organic compound having Si-H bonds is a chain siloxane expressed by the general formula $R_nH_{3-n}SiO(R_kH_{2-k}SiO)_mSiH_{3-n}R_n$ (n=1, 2; k=0 to 2; m≧0), wherein R is a member selected from the group consisting of alkyl, aryl and their derivatives.

6. The method of forming an insulating film according to claim 5, wherein said organic compound having Si-H bonds is a chain siloxane derivative expressed by the general formula $(RO)_nH_{3-n}SiOSiH_{3-n}(OR)_n$ (n=1, 2), wherein R is a member selected from the group consisting of alkyl and aryl.

7. The method of forming an insulating film according to claim 2, wherein said organic compound having Si-H bonds is a ring siloxane expressed by the general formula $(R_kH_{2-k}SiO)_m$ (k=1; m≧2), wherein R is a member selected from the group consisting of alkyl, aryl and their derivatives.

8. A method of forming an insulating film according to claim 1, wherein said oxidizing gas includes at least one gas selected from the group consisting of $O_2$, NO, $N_2O$, $NO_2$, CO, $CO_2$ and $H_2O$.

9. A method in accordance with claim 1 further comprising:
    (d) repeating step (a) to form a second plasma; and
    (e) contacting said silicon oxide layer with said second plasma to form a silicon-containing insulating film covering said silicon oxide layer.

10. A method in accordance with claim 1 wherein said deposition substrate includes a plurality of spaced interconnection layers whereby said interconnection layers become coated with said insulating film in step (b) and spaces between said interconnection layers become filled by said silicon oxide layer in step (c).

11. A method of forming a silicon device comprising:
    (a) providing a deposition substrate having one surface coated with a silicon oxide layer formed by thermal CVD;
    (b) forming a plasma from a gas containing at least one organic compound having Si-H bonds and an oxidizing gas; and
    (c) contacting said deposition substrate with said plasma to form a silicon-containing insulating film covering said silicon oxide layer.

12. A method in accordance with claim 11 wherein said deposition substrate includes a plurality of spaced interconnection layers, said interconnection layers being covered by said silicon oxide layer, with spaces between said interconnection layers being filled by said silicon oxide layer.

13. The method of forming an insulating film according to claim 11, wherein said organic compound having Si-H bonds is selected from the group consisting of alkylsilanes, arylsilanes, alkoxysilanes and siloxanes.

14. The method of forming an insulating film according to claim 13, wherein said alkylsilanes and arylsilanes are represented by the general formula $R_n SiH_{4-n}$ (n=1 to 3), wherein R is a member selected from the group consisting of alkyl, aryl and their derivatives.

15. The method of forming an insulating film according to claim 13, wherein said organic compound containing Si-H bonds is an alkoxysilane and said alkoxysilane is expressed by a general formula $(RO)_n SiH_{4-n}$ (n=1 to 3), wherein R is alkyl or a derivative thereof.

16. The method of forming an insulating film according to claim 13, wherein said organic compound having Si-H bonds is a chain siloxane expressed by the general formula $R_n H_{3-n} SiO(R_k H_{2-k} SiO)_m SiH_{3-n} R_n$ (n=1, 2; k=0 to 2; m≥0), wherein R is a member selected from the group consisting of alkyl, aryl and their derivatives.

17. The method of forming an insulating film according to claim 16, wherein said organic compound having Si-H bonds is a chain siloxane derivative expressed by the general formula $(RO)_n H_{3-n} SiOSiH_{3-n}(OR)_n$ (n=1, 2), wherein R is a member selected from the group consisting of alkyl and aryl.

18. The method of forming an insulating film according to claim 13, wherein said organic compound having Si-H bonds is a ring siloxane expressed by the general formula $(R_k H_{2-k} SiO)_m$ (k=1; m≥2), wherein R is a member selected from the group consisting of alkyl, aryl and derivatives thereof.

19. A method of forming an insulating film according to claim 11, wherein said oxidizing gas includes at least one gas selected from the group consisting of $O_2$, NO, $N_2O$, $NO_2$, CO, $CO_2$ and $H_2O$.

* * * * *

UNITED STATES PATENT AND TRADEMARK OFFICE
CERTIFICATE OF CORRECTION

PATENT NO. : 5,554,570
DATED : September 10, 1996
INVENTOR(S) : MAEDA et al

It is certified that error appears in the above-indentified patent and that said Letters Patent is hereby corrected as shown below:

On the title page, item

"[73] Assignees: Alcantech Co., Inc." should read
--[73] Assignees: Alcan-Tech Co., Inc.--.

Col. 2, line 67, "arylsilanes" should read --allylsilanes--.
Col. 5, line 35, "86!n" should read --86°C--.
Col. 7, line 34, "TECTS has a the formula" should read --TECTS has the formula--.
Col. 8, line 19, "Dower" should read --power--.

Signed and Sealed this

Nineteenth Day of August, 1997

Attest:

BRUCE LEHMAN

Attesting Officer

Commissioner of Patents and Trademarks